(12) United States Patent
Akiyama

(10) Patent No.: US 7,288,783 B2
(45) Date of Patent: Oct. 30, 2007

(54) OPTICAL SEMICONDUCTOR DEVICE AND METHOD FOR FABRICATING THE SAME

(75) Inventor: Tomoyuki Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/298,011

(22) Filed: Nov. 18, 2002

(65) Prior Publication Data

US 2003/0129779 A1 Jul. 10, 2003

(30) Foreign Application Priority Data

Jan. 7, 2002 (JP) ............................. 2002-000955

(51) Int. Cl.
*H01L 33/00* (2006.01)
(52) U.S. Cl. .................. 257/13; 257/97; 257/622; 372/45
(58) Field of Classification Search ........... 257/13, 257/96, 97, 622; 372/45
See application file for complete search history.

(56) References Cited

U.S. PATENT DOCUMENTS 4,276,098 A * 6/1981 Nelson et al. ........... 438/40
4,731,790 A * 3/1988 Sawai .................. 372/46.01
5,608,229 A * 3/1997 Mukai et al. ............ 257/14
6,653,653 B2 * 11/2003 Brousseau, III .......... 257/39
6,683,013 B2 * 1/2004 Kim et al. ......... 257/E21.119
6,744,960 B2 * 6/2004 Pelka .................... 385/130

FOREIGN PATENT DOCUMENTS

| JP | HEI 05-21903 (A) | 1/1993 |
| JP | 05-343800 | 12/1993 |
| JP | 06-132614 | 5/1994 |
| JP | 08-125256 | 5/1996 |
| JP | 08-201739 | 8/1996 |
| JP | 2001-308467 | 11/2001 |

* cited by examiner

*Primary Examiner*—Jerome Jackson
(74) *Attorney, Agent, or Firm*—Kratz, Quintos & Hanson, LLP

(57) ABSTRACT

Quantum dots are formed on a plurality of surfaces whose normal direction are different from each other. The quantum dots are formed on the surfaces normal to each other, whereby the polarization dependency can be eliminated as described above. Thus, the optical semiconductor device can have very low polarization dependency.

2 Claims, 13 Drawing Sheets

LIGHT PROPAGATION DIRECTION

LIGHT PROPAGATION DIRECTION

LIGHT PROPAGATION DIRECTION

OPTICAL SEMICONDUCTOR DEVICE AND METHOD FOR FABRICATING THE SAME

CROSS-REFERENCE TO RELATED APPLICATION

This application is based upon and claims priority of Japanese Patent Application No.2002-955, filed on Jan. 7, 2002, the contents being incorporated herein by reference.

BACKGROUND OF THE INVENTION

1. Field of the Invention

The present invention relates to an optical semiconductor device and a method for fabricating the optical semiconductor device, more specifically to an optical semiconductor device including quantum dots and a method for fabricating the same.

2. Description of the Related Art

Semiconductor optical amplifiers and semiconductor lasers are much noted in the field of optical communication, etc. for their small sizes and small electric power consumption.

A conventional optical semiconductor device will be explained with reference to FIG. 12. FIG. 12 is a sectional view of the conventional optical semiconductor device.

As shown in FIG. 12, a clad layer 112 of n type InP is formed on a semiconductor substrate 110 of n type InP.

A quantum well active layer 124 is formed on the clad layer 112.

A clad layer 136 is formed on the quantum well active layer 124. The clad layer 136, the bulk active layer 124 and the clad layer 112 generally form a mesa. Thus, an optical waveguide layer 138 in mesa is formed.

A current restricting layer 118 formed of a p type InP layer 118a and an n type InP layer 118b is formed on both sides of the optical waveguide layer 138.

A cap layer 140 is formed of n type InP on the optical waveguide layer 138 and the current restricting layer 118.

An AR (Anti-Reflection) coated film (not shown) is formed on both end surfaces of the mesa-optical waveguide layer 138. Thus, the conventional semiconductor optical amplifier is constituted.

However, the above-described conventional optical semiconductor device has a narrow gain bandwidth, and cannot amplify at once WDM (Wavelength Division Multiplexing) signals in a wide band.

Then, it is proposed to use quantum dots as the active layer. FIG. 13 is a conceptual view of the proposed optical semiconductor device.

As shown in FIG. 13, quantum dots 102 are formed in an upper part of a semiconductor substrate 100.

Quantum dots are thus used as the active layer, whereby an optical semiconductor device having a wide gain bandwidth can be provided.

However, the proposed optical semiconductor device shown in FIG. 13 has high polarization dependency. In order to make the proposed optical semiconductor device practically usable, it is necessary to reduce the polarization dependency.

SUMMARY OF THE INVENTION

An object of the present invention is to provide an optical semiconductor device including an active layer including quantum dots which can reduce the polarization dependency and a method for fabricating the optical semiconductor device.

According to one aspect of the present invention, there is provided an optical semiconductor device comprising an active layer including quantum dots, the quantum dots being formed on a plurality of surfaces whose normal directions are different from each other.

According to another aspect of the present invention, there is provided a method for fabricating an optical semiconductor device comprising the steps of: forming on a semiconductor substrate a plurality of surfaces whose normal directions are different from each other; and forming on the plurality of surfaces an active layer including quantum dots.

As described above, according to the present invention, the quantum dots are formed on a plurality of surfaces whose normal directions are different from each other, whereby the polarization dependency can be reduced. Thus, the present invention can provide an optical semiconductor device having very low polarization dependency and a method for fabricating the optical semiconductor device.

DETAILED DESCRIPTION OF THE INVENTION

Principle of the Invention

Figure 1A:
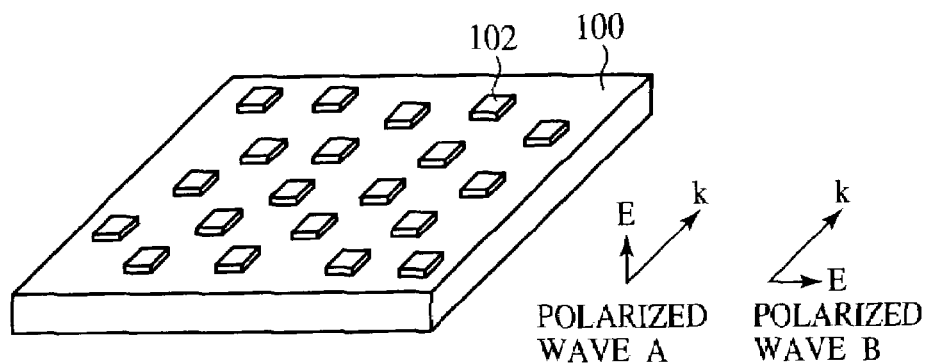
FIGS. 1A and 1B are conceptual views explaining the principle of the present invention.

FIG. 1A is a conceptual view of the proposed optical semiconductor device.

A plurality of quantum dots 102 are formed on a substrate 100.

In the optical semiconductor device in which light propagates through the optical waveguide layer, the propagation direction of light is a direction parallel to the surfaces of the substrate 100, i.e., the direction of a vector k in the drawing.

As shown in FIG. 1A, the quantum dots 102 have a flat configuration. A dimension of the quantum dots 102 in the direction parallel to the surfaces of the substrate 100, and a dimension of the quantum dots 102 in the direction vertical to the surfaces of the substrate 100 are different from each other. A gain $g_A$ of a polarized wave A having a direction of an electric filed vector E vertical to the substrate surfaces, and a gain $g_B$ of a polarized wave B having an electric field vector E parallel to the substrate surfaces are different from each other.

Accordingly, the proposed optical semiconductor device shown in FIG. 1A has high polarization dependency.

The inventor of the present invention has made earnest studies and found that quantum dots are formed in flat surfaces which are normal to each other, whereby the polarization dependency can be reduced.

Figure 1B:
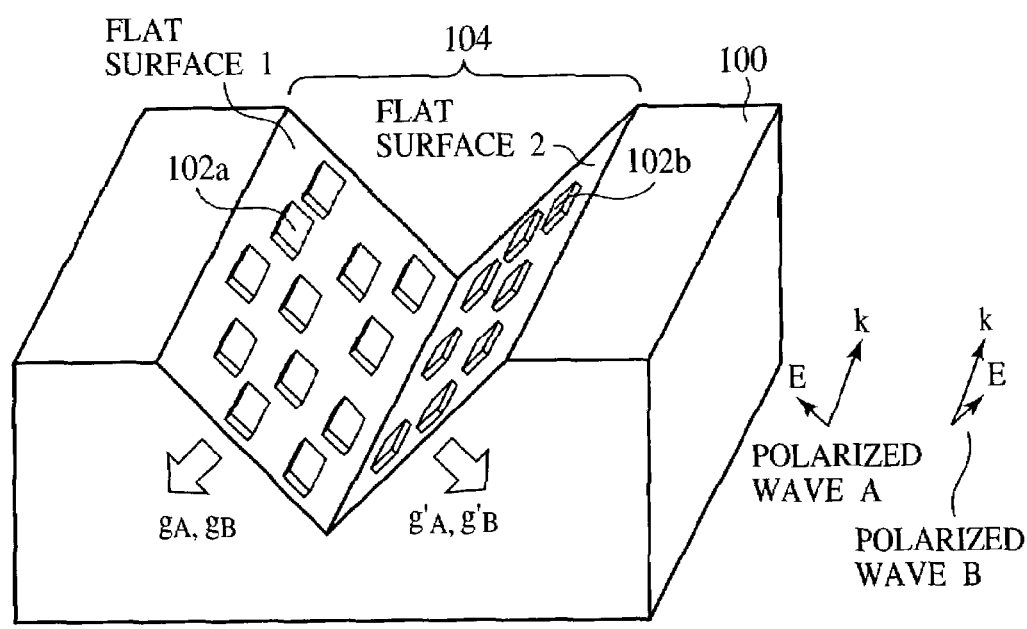

FIG. 1B is a conceptual view explaining the principle of the present invention.

As shown in FIG. 1B, a V-shaped groove 104 is form in a substrate 100. A flat surface 1 and a flat surface 2 which are the surfaces of the V-shaped groove 104 are normal to each other. Quantum dots 102a, 102b are formed respectively on the flat surface 1 and the flat surface 2.

In the optical semiconductor device shown in FIG. 1 B, because the quantum dots 102a, 102bare formed respectively on the flat surface 1 and the flat surface 2, which are normal to each other, a dimension of the quantum dots 102a in the direction of an electric filed vector E of a polarized wave A, i.e., in the direction parallel to the flat surface 1, and a dimension of the quantum dots 102b in the direction of the electric filed vector E of the polarized wave A are different from each other.

Accordingly, a gain $g_A$ of the polarized wave A by the quantum dots 102a, and a gain $g'_A$ of the polarized wave A by the quantum dots 102b are different from each other.

In the optical semiconductor device shown in FIG. 1B, because the quantum dots 102a, 102b are formed respectively on the flat surface 1 and the flat surface 2, which are normal each other, a dimension of the quantum dots 102a in the direction of an electric filed vector E of a polarized wave B, i.e., in the direction parallel to the flat surface 1, and a dimension of the quantum dots 102b in the direction of the electric filed vector E of the polarized wave B are different from each other.

Accordingly, a gain $g_B$ of the polarized wave B by the quantum dots 102a, and a gain $g'_B$ of the polarized wave B by the quantum dots 102b are different from each other.

However, the direction of the electric field vector E of the polarized wave A and the direction of the electric field vector E of the polarized wave B are normal to each other, whereby a gain $g'_A$ of the polarized wave A by the quantum dots 102b and a gain $g_B$ of the polarized wave B by the quantum dots 102a are equal to each other. Accordingly, the relationship $$g'_A = g_B$$

is given.

The direction of the electric field vector E of the polarized wave A and the direction of the electric field vector E of the polarized wave B are normal to each other, whereby a gain $g_A$ of the polarized wave A by the quantum dots 102a and a gain $g'_B$ of the polarized wave B by the quantum dots 102 are equal to each other. Accordingly, the relationship $$g_A = g'_B$$

is given.

Thus, when a gain totally by the quantum dots 102a and 102b formed on the flat surfaces 1 and 2 is considered, a gain $g_A + g'_A$ of the polarized wave A is equal to a gain $g_B + g'_B$ of the polarized wave B.

The quantum dots 102a, 102b are thus formed on the surfaces which are normal to each other, whereby a gain of the polarized wave A and a gain of the polarized wave B can be made equal to each other.

Thus, the present invention can provide an optical semiconductor device whose polarization dependency is very low.

A First Embodiment

Figure 2:
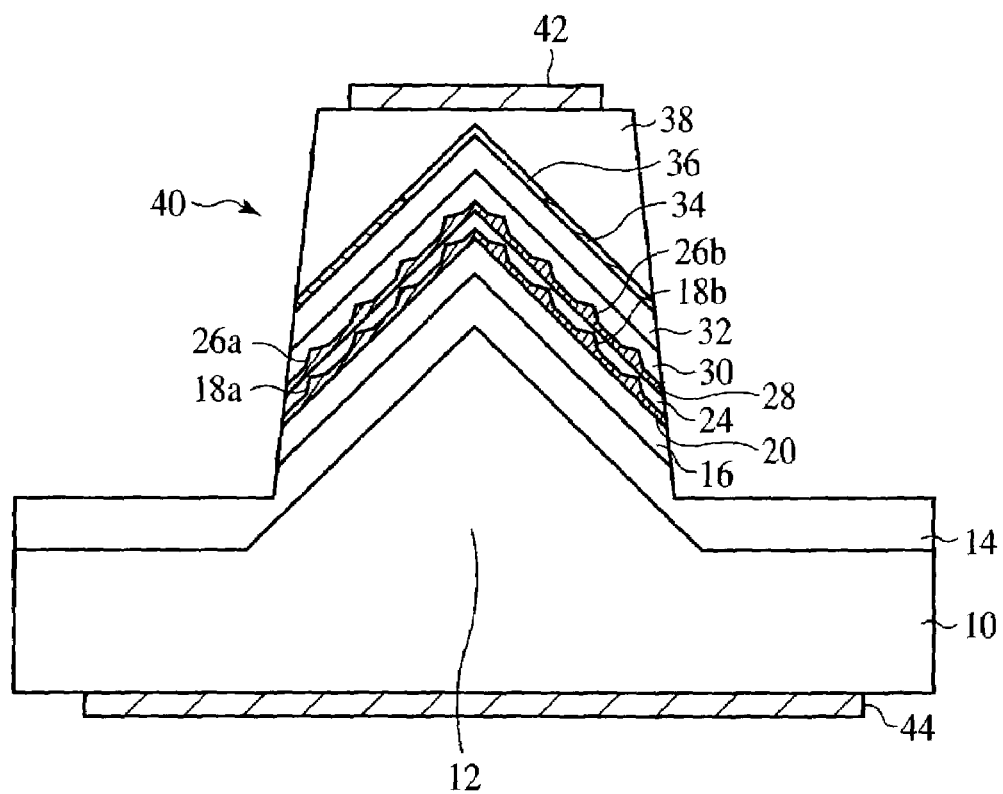
FIG. 2 is a sectional view of the optical semiconductor device according to a first embodiment of the present invention.

The optical semiconductor device according to a first embodiment of the present invention and the method for fabricating the optical semiconductor will be explained with reference to FIG. 2. FIG. 2 is a sectional view of the optical semiconductor device according to the present embodiment. FIGS. 3A to 4B are sectional views of the optical semiconductor device according to the present embodiment in the steps of the method for fabricating the same, which show the method.

In the present embodiment, the principle of the present invention is applied to a semiconductor optical amplifier. The principle of the present invention is not limited to the application to the semiconductor optical amplifiers and is applicable to all the optical semiconductor devices, such as semiconductor lasers, etc.

Optical Semiconductor Device

The optical semiconductor device according to the present embodiment will be explained with reference to FIG. 2.

As shown in FIG. 2, Λ-shaped ridges 12 of n type GaAs are formed on a semiconductor substrate 10 of n type GaAs. Two surfaces defining the ridge 12 are normal to each other.

A clad layer 14 of n type $Al_{0.4}Ga_{0.6}As$ is formed on the semiconductor substrate 10 with the ridge 12 formed on.

A core layer 16 of GaAs is formed on the clad layer 14.

An InAs layer 20 with a plurality of quantum dots 18a, 18b self-formed thereon is formed on the core layer 16. The quantum dots 18a, 18b can be formed by, e.g., Stranski-Krastanow mode (hereinafter called "S-K mode"). In S-K mode, epitaxially grown semiconductor crystals which are to epitaxially grow make two-dimensional growth (film growth) at the start of the growth and make three-dimensional growth at the stage where the film has exceeded its elastic limit. To self-form the quantum dots 18a, 18b in three-dimensionally grown islands by S-K mode, it is necessary to form a film of a lattice constant larger than that of a material of the base film. S-K mode is generally used for its easy self-formation.

A core layer 24 of GaAs is formed on the InAs layer 20.

An InAs layer 28 with a plurality of quantum dots 26a, 26b self-formed is formed on the core layer 24. The InAs layer 28 is the same as the InAs layer 24.

A core layer 30 of GaAs is formed on the InAs layer 28.

A p type $Al_{0.4}Ga_{0.6}As$ layer 32 is formed on the core layer 30.

A current restricting layer 34 of $Al_2O_3$ 34 and a current passing layer 36 of AlAs are formed on the p type $Al_{0.4}Ga_{0.6}As$ layer 32.

A clad layer 38 of p type $Al_{0.4}Ga_{0.6}As$ is formed on the current restricting layer 34 and the current passing layer 36.

The layer film of the clad layer 38, the current restricting layer 34, the p type $Al_{0.4}Ga_{0.6}As$ layer 32, the core layer 30, the InAs layer 28, the core layer 24, the InAs layer 20, the core layer 16 and the clad layer 14 is generally etched in mesa. Thus, striped optical waveguide layer 40 is formed.

An AR coat film (not shown) is formed on both end surfaces of the optical waveguide layer 40.

An upper electrode 42 is formed on the optical waveguide layer 40.

A lower electrode 44 is formed under the bottom surface of the semiconductor substrate 10.

Thus, the optical semiconductor device according to the present embodiment is constituted.

The optical semiconductor device according to the present embodiment is characterized mainly in that the quantum dots 18a, 18b, 26a, 26b are formed on the surfaces which define the Λ-shaped ridge and are normal to each other.

In the present embodiment, the quantum dots are formed on the surfaces normal to each other, whereby the polarization dependency can be eliminated as described above. Thus, the optical semiconductor device according to the present embodiment can have very low polarization dependency.

Method for Fabricating the Optical Semiconductor Device

Then, the method for fabricating the optical semiconductor device according to the present embodiment will be explained with reference to FIGS. 3A to 4B.

Figure 3A:
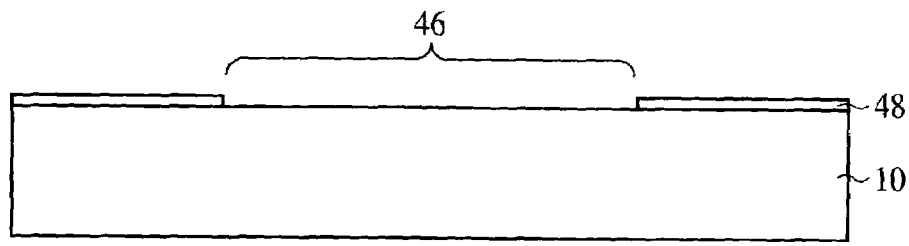
FIGS. 3A to 3C are sectional views of the optical semiconductor device according to the first embodiment in the steps of the method for fabricating the same, which show the method (Part 1).

As shown in FIG. 3A, a mask 48 of a silicon oxide film with a stripe-shaped opening 46 formed in the central part thereof is formed on a semiconductor substrate 10 of n type GaAs. In FIG. 3A, the vertical direction as viewed in the drawing is [110] direction.

Figure 3B:
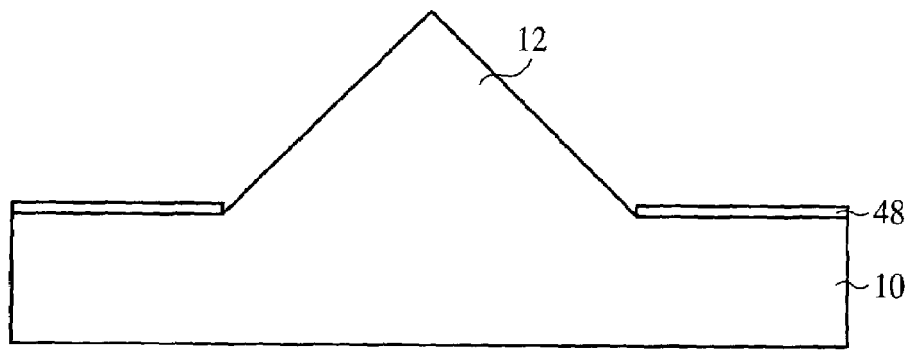

Then, an n type GaAs layer is grown by MOCVD. The n type GaAs layer grown on the semiconductor substrate 10 with [100] direction oriented vertical as viewed in FIG. 3A grows into a ridge-shape. Thus, the ridge 12 of n type GaAs is formed as shown in FIG. 3B.

Figure 3C:
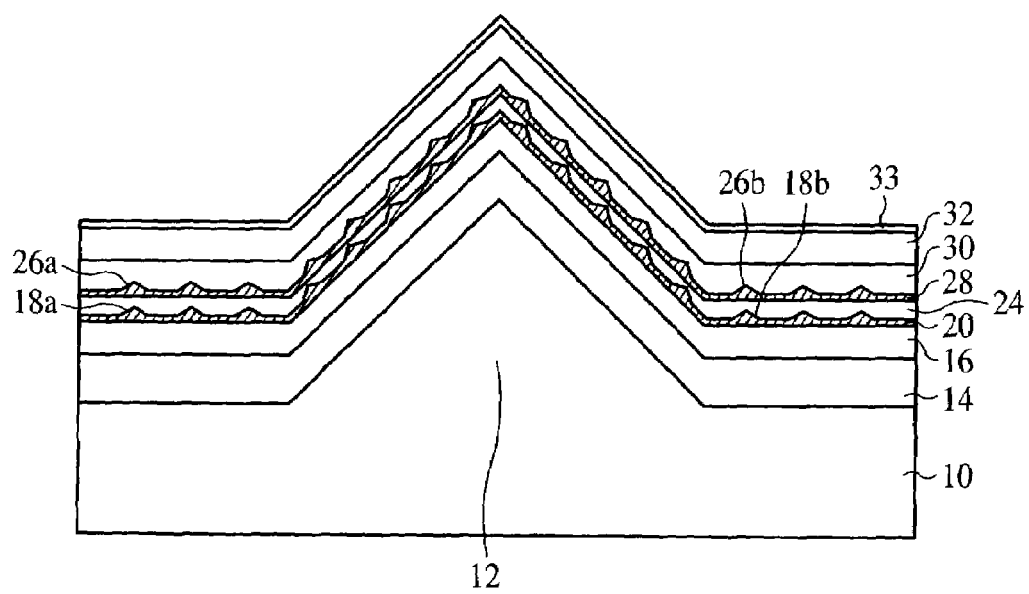

Next, as shown in FIG. 3C, the clad layer 14 of a 1.4 μm-thickness n type $Al_{0.4}Ga_{0.6}As$ film is formed on the entire surface by MOCVD.

Then, the core layer 16 of a 0.1 μm-thickness GaAs film is formed on the entire surface by MOCVD.

Then, the InAs layer 20 is formed on the entire surface by MOCVD. InAs, whose lattice constant is larger than that of GaAs forming the core layer, permits the quantum dots 18a, 18b to be self-formed by S-K mode. Conditions for forming the InAs layer 20 are, e.g., a 500° C.-substrate temperature and about a 2 ML InAs feed amount and 250 seconds of growing time.

Then, the core layer 24 of a 30 nm-thickness GaAs is formed on the entire surface by MOCVD.

Next, the InAs layer 28 is grown on the entire surface by MOCVD. Conditions for growing the InAs layer 28 are the same as, e.g., those for growing the InAs layer 20. Thus, the quantum dots 26a, 26b are self-formed.

The core layer 30 of a 0.1 μm-thickness GaAs film is formed on the entire surface by MOCVD.

Next, the p type $Al_{0.4}Ga_{0.6}As$ layer 32 of a 0.25 μm-thickness is formed on the entire surface by MBE.

Then, the AlAs layer 33 of a 30 nm-thickness is formed on the entire surface by MOCVD.

Figure 4A:
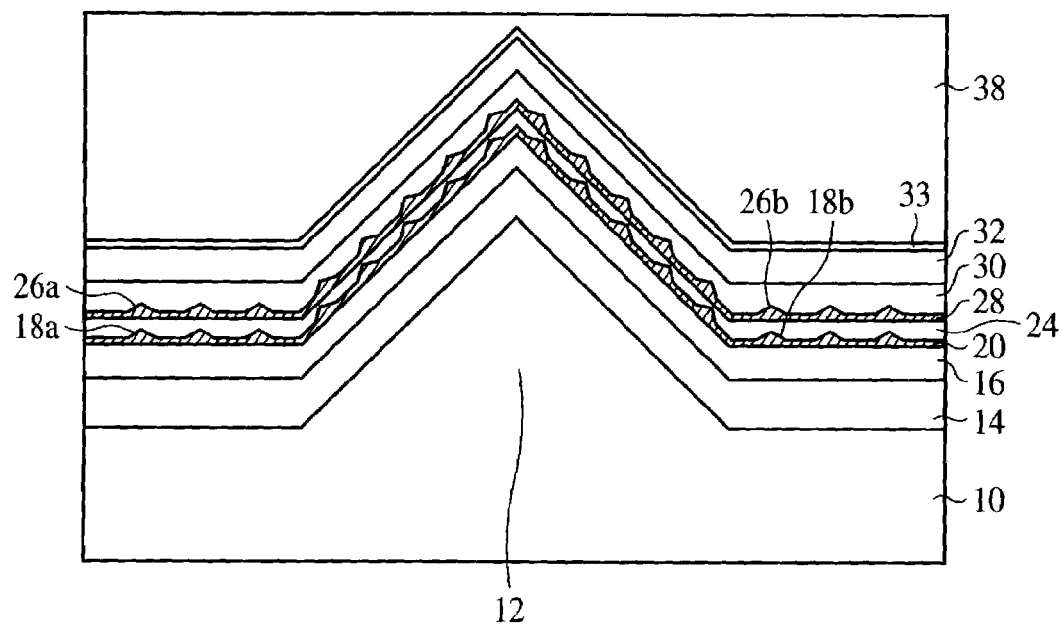
FIGS. 4A and 4B are sectional views of the optical semiconductor device according to the first embodiment in the steps of the method for fabricating the same, which show the method (Part 2).

Then, as shown in FIG. 4A, the clad layer 38 of a 1 μm-thickness p type $Al_{0.4}Ga_{0.6}As$ film is formed on the entire surface by MOCVD.

Figure 4B:
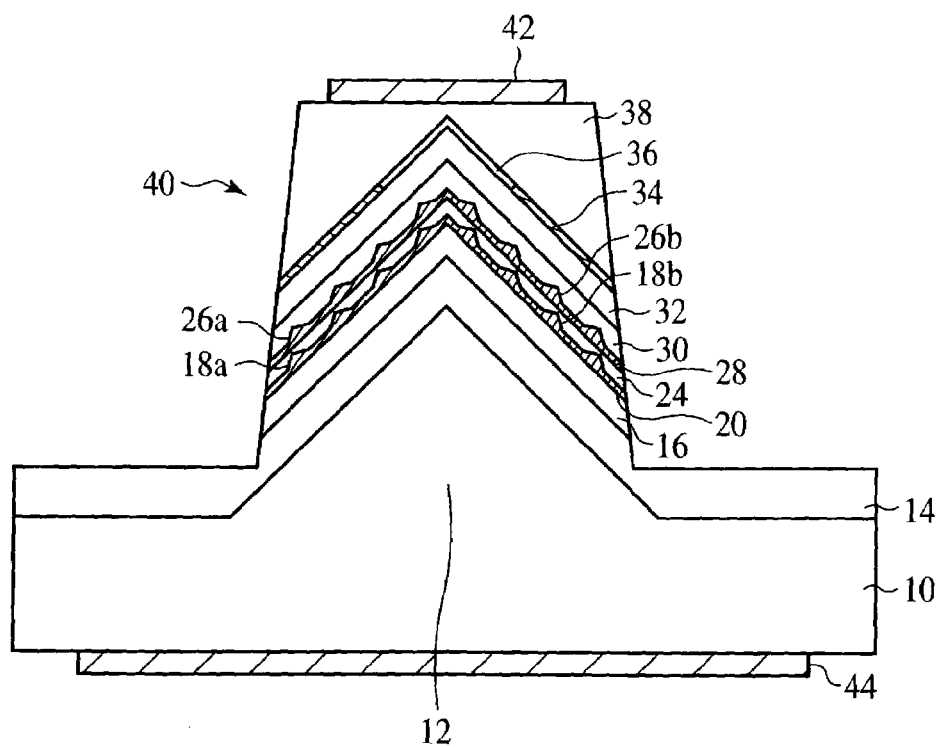

As shown in FIG. 4B, the layer film of the clad layer 38, the AlAs layer 33, the p type $Al_{0.4}Ga_{0.6}As$ layer 32, the core layer 30, the InAs layer 28, the core layer 24, the InAs layer 20, the core layer 16 and the clad layer 14 is etched into mesa. Thus, the stripe-shaped optical waveguide layer 40 is formed.

Then, in an oxidation atmosphere, the AlAs layer 33 except that at the center of the optical waveguide layer 40 is oxidized to thereby form the current restricting layer 34 of $Al_2O_3$. The AlAs layer 33 which has not been oxidized becomes the current passing layer 36.

Next, the AR coat film (not shown) is formed on both end surfaces of the optical waveguide layer 40.

Then, the upper electrode 42 is formed on the optical waveguide layer 40. The lower electrode 44 is formed under the bottom surface of the semiconductor substrate 10.

Thus, the optical semiconductor device according to the present embodiment is fabricated.

Evaluation Result

Figure 5:
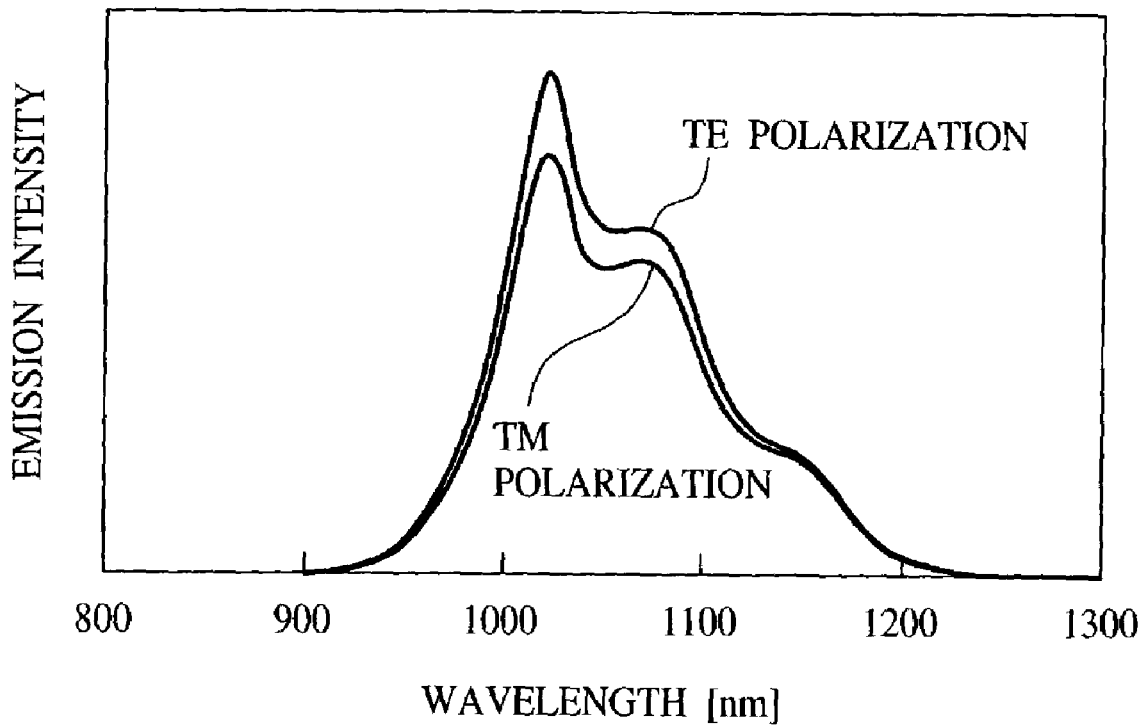
FIG. 5 is a graph of emission spectrum of the optical semiconductor device according to the first embodiment of the present invention.

The result of evaluating the optical semiconductor device according to the present embodiment will be explained with reference to FIG. 5. FIG. 5 is a graph emission spectrum of the optical semiconductor device according to the present embodiment.

Wavelengths are taken on the horizontal axis, and emission intensities are taken on the vertical axis. In the drawing, TM polarized light means a TM component of light emitted by the optical semiconductor device according to the present embodiment. TE polarized light means a TE component of light emitted by the optical semiconductor device according to the present embodiment.

As seen in FIG. 5, the difference between the emission intensities of the TM polarized light and those of the TE polarized light is depressed to be very small, which is less than 15%.

Based on this, according to the present embodiment, the optical semiconductor device having low polarization dependency can be provided.

A Second Embodiment

Figure 6:
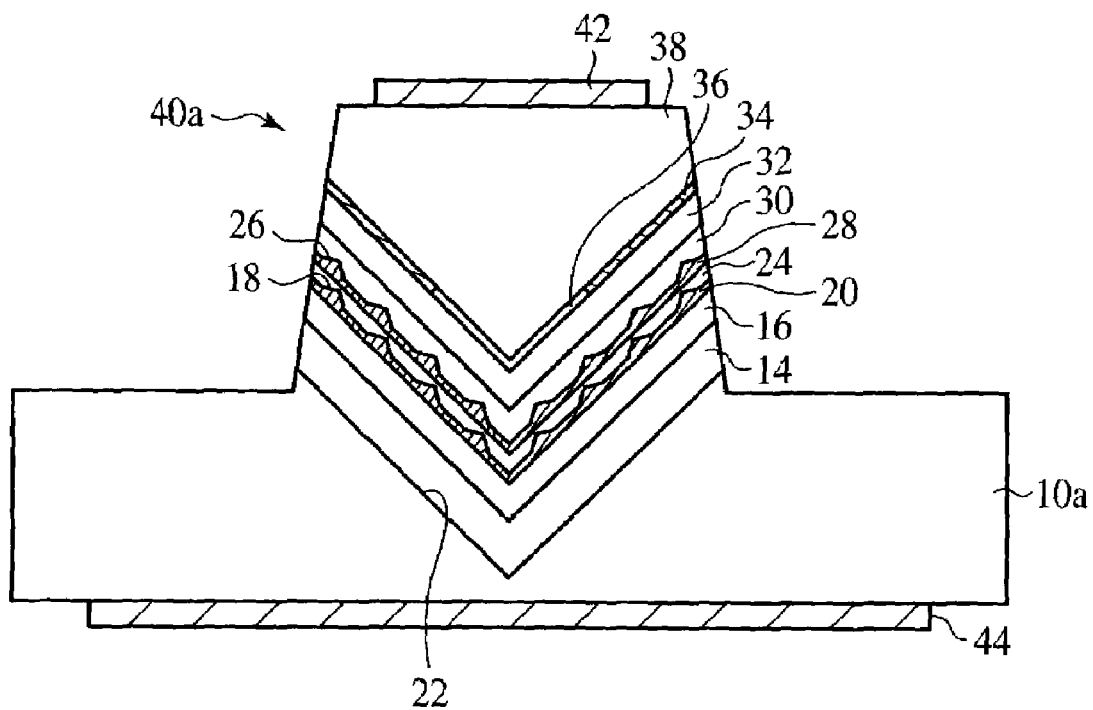
FIG. 6 is a sectional view of the optical semiconductor device according to a second embodiment of the present invention.

The optical semiconductor device according to a second embodiment of the present invention and the method for fabricating the optical semiconductor device will be explained with reference to FIGS. 6 to 8B. FIG. 6 is a sectional view of the optical semiconductor device according to the present embodiment. FIGS. 7A to 8B are sectional views of the optical semiconductor device according to the present embodiment in the steps of the method for fabricating the same, which show the method. The same members of the present embodiment as those of the optical semiconductor device according to the first embodiment and the method for fabricating the same shown in FIGS. 1A to 5 are represented by the same reference numbers not to repeat or to simplify their explanation.

Semiconductor Device

First, the optical semiconductor device according to the present embodiment will be explained with reference to FIG. 6.

The optical semiconductor device according to the present embodiment is characterized mainly in that quantum dots are formed on surfaces which define a V-shaped groove and are normal to each other.

As shown in FIG. 6, V-shaped groove 22 are formed in a semiconductor substrate 10a. The surfaces of the V-shaped groove 22 are normal to each other.

On the semiconductor substrate 10a with the V-shaped groove 22 formed in, as in the first embodiment, a clad layer 14, a core layer 16, an InAs layer 20 with quantum dots 18 self-formed, a core layer 24, an InAs layer 28 with quantum dots 26 self-formed, a core layer 30, a p type $Al_{0.4}Ga_{0.6}As$ layer 32, a current restricting layer 34, a current passing layer 36 and a clad layer 38 are sequentially formed.

The layer film of the clad layer 38, the current restricting layer 34, the p type $Al_{0.4}Ga_{0.6}As$ layer 32, the clad layer 30, the InAs layer 28, the core layer 24, the InAs layer 20, the core layer 16 and the clad layer 14 is etched generally in mesa, as is in the first embodiment. Thus, a stripe-shaped optical waveguide layer 40a is formed.

An AR coat film (not shown) is formed on both end surfaces of the optical waveguide layer 40a.

An upper electrode 42 is formed on the optical waveguide layer 40a. A lower electrode 44 is formed under the bottom surface of the semiconductor substrate 10.

Thus, the optical semiconductor device according to the present embodiment is constituted.

The optical semiconductor device according to the present embodiment is characterized mainly in that the quantum dots 18, 26 are formed on two surfaces which define the V-shaped groove 22 and are normal to each other. As described above, the quantum dots are formed on the surfaces normal to each other, whereby the polarization dependency can be eliminated. Thus, the optical semiconductor device according to the present embodiment can have very low polarization dependency, as is the optical semiconductor device according to the first embodiment.

Method for Fabricating the Optical Semiconductor Device

Next, the method for fabricating the optical semiconductor device according to the present embodiment will be explained with reference to FIGS. 7A to 8B.

Figure 7A:
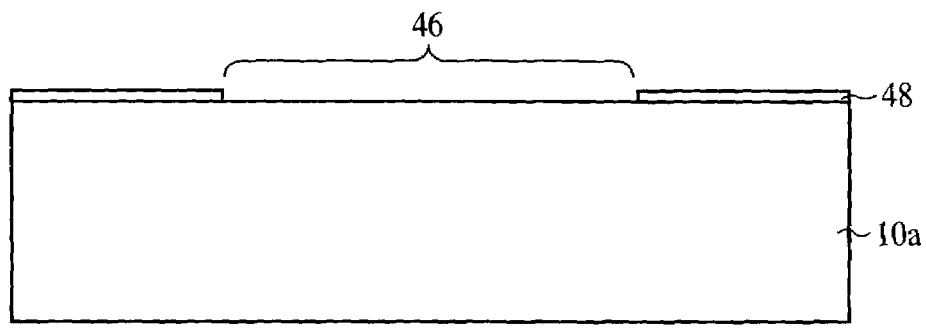
FIGS. 7A to 7C are sectional views of the optical semiconductor device according to the second embodiment in the steps of the method for fabricating the same, which explain the method (Part 1).

As shown in FIG. 7A, a mask 48 of a silicon oxide film with a stripe-shaped opening 46 formed in the central part thereof is formed on a semiconductor substrate 10a of n type GaAs. In FIG. 7A, the vertical direction as viewed in the drawing is [110] direction.

Figure 7B:
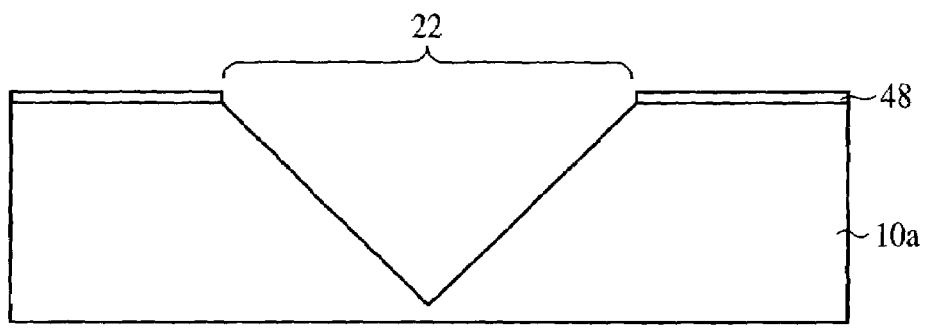

Then, with the mask 48 as a mask, the semiconductor substrate 10a is etched. The semiconductor substrate 10a with [110] direction oriented vertical as viewed in FIG. 7A is etched into the V-shape. As shown in FIG. 7B, the V-shaped groove 22 is thus formed in the semiconductor substrate 10a.

Figure 7C:
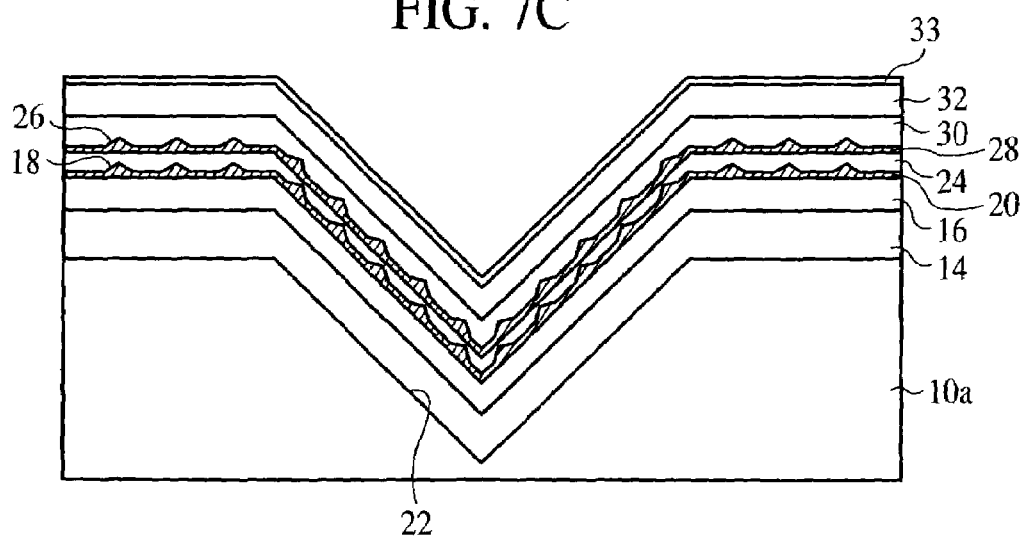

Then, in the same way as in the method for fabricating the optical semiconductor device described above with reference to FIG. 3C, the clad layer 14, the core layer 16, the InAs layer 20, the core layer 24, the InAs layer 28, the core layer 30, the p type $Al_{0.4}Ga_{0.6}As$ layer 32 and the AlAs layer 33 are sequentially grown on the entire surface (FIG. 7C).

Figure 8A:
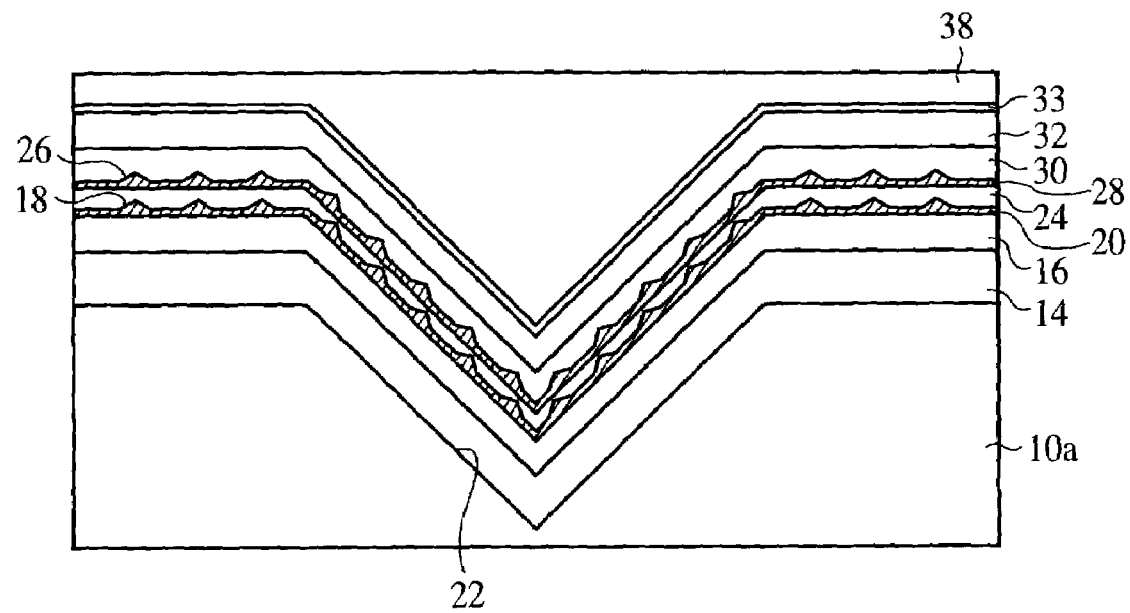
FIGS. 8A and 8B are sectional views of the optical semiconductor device according to the second embodiment in the steps of the method for fabricating the same, which explain the method (Part 2).

Next, the clad layer 38 is grown on the entire surface in the same way as in the method for fabricating the optical semiconductor device described above with reference to FIG. 4A (FIG. 8A).

In the same was as in the method for fabricating the optical semiconductor device described above with reference to FIG. 4B, the layer film of the clad layer 38, the AlAs layer 33, the p type $Al_{0.4}Ga_{0.6}As$ layer 32, the core layer 30, InAs layer 28, the core layer 24, the InAs layer 20, the core layer 16 and the clad layer 14 is etched into mesa. Thus, as shown in FIG. 8B, the stripe-shaped optical waveguide layer 40 is formed.

Figure 8B:
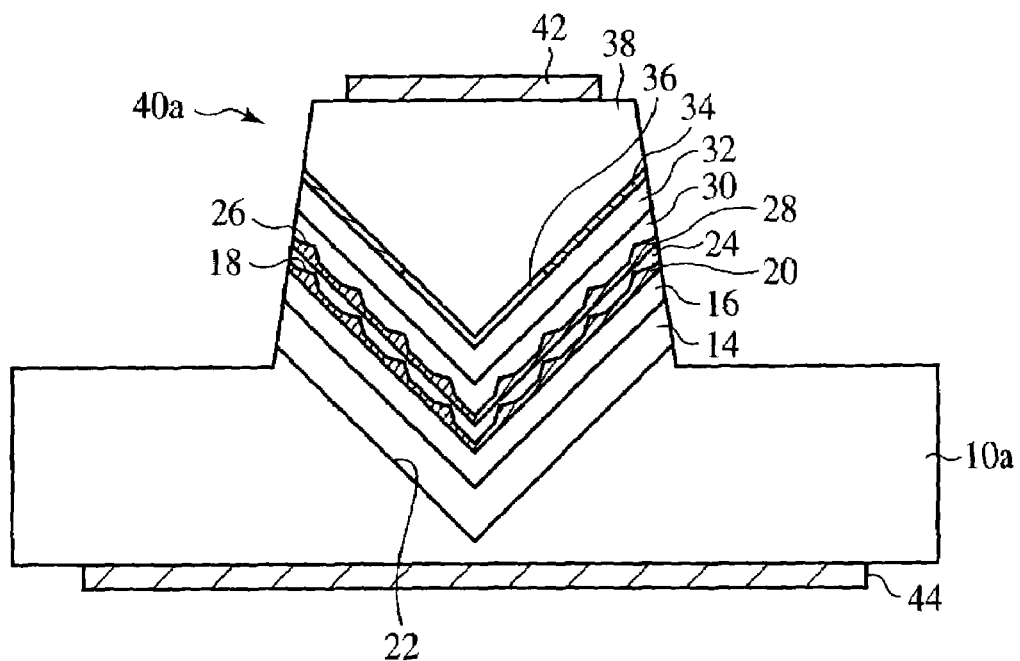

The following steps of the optical semiconductor device according to the present embodiment shown in FIG. 8B are the same as those of the method for fabricating the optical semiconductor device described above with reference to FIG. 4B, and their explanation is not repeated.

Thus, the optical semiconductor device according to the present embodiment is fabricated.

Modified Embodiments

The present invention is not limited to the above-described embodiments and can cover other various modifications.

For example, in the above-described embodiments, the quantum dots are formed on the surfaces normal to each other. However, the surfaces with the quantum dots formed on are not essentially normal to each other. The quantum dots are formed on surfaces which cross each other, whereby the polarization dependency can be reduced.

Figure 9:
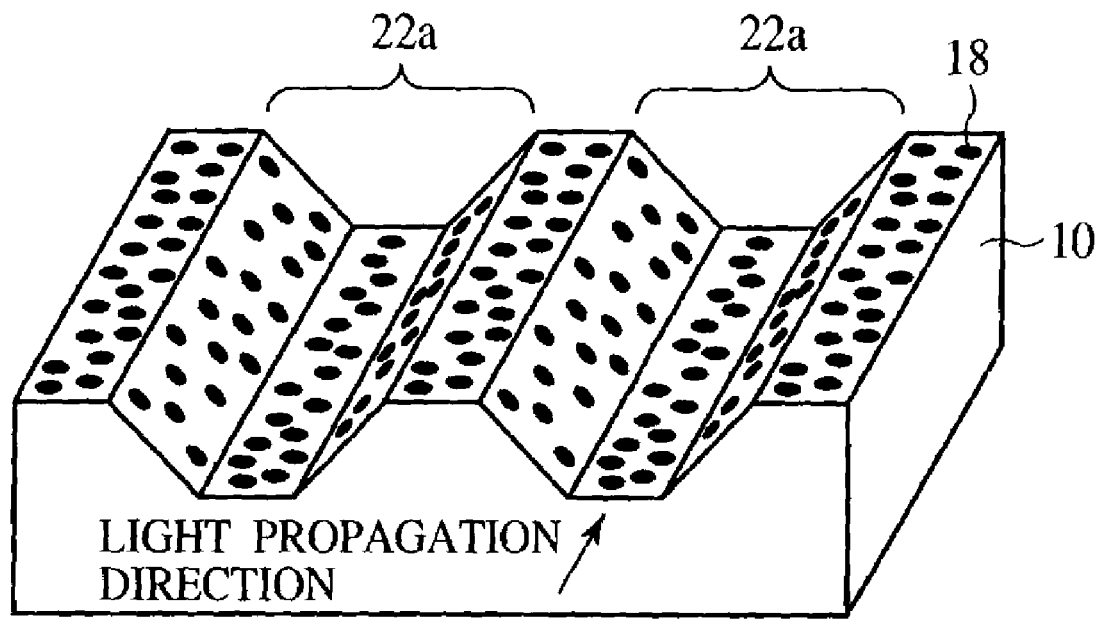
FIG. 9 is a conceptual view of the optical semiconductor device according to a modified embodiment of the present invention (Part 1).
Figure 10:
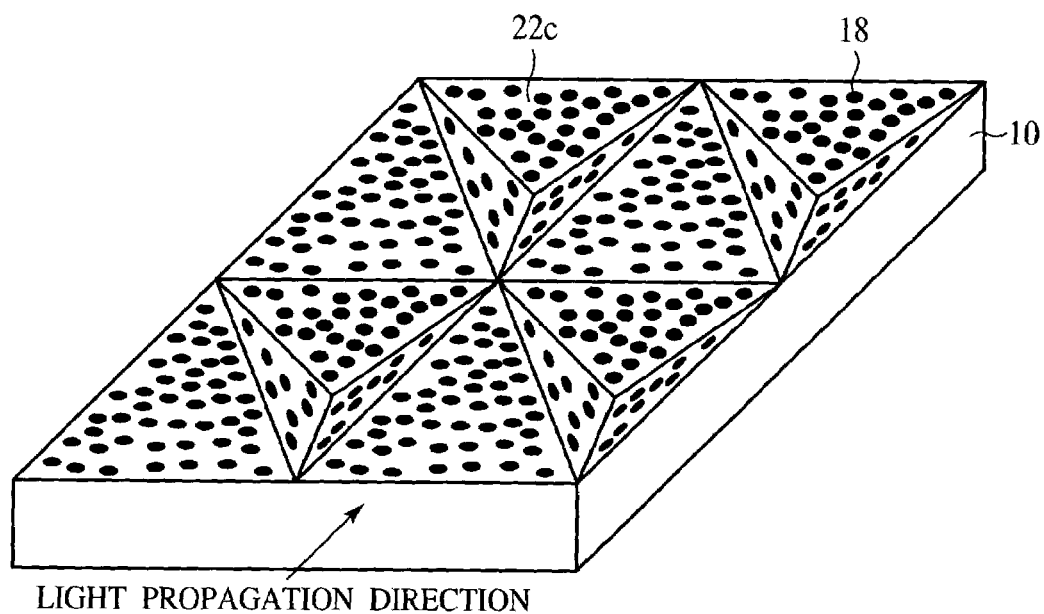
FIG. 10 is a conceptual view of the optical semiconductor device according to a modified embodiment of the present invention (Part 2).

In the second embodiment, the V-shaped groove 22 is formed. However, the groove is not essentially V-shaped. Grooves 22a of the configuration shown in FIG. 9 may be formed. In the grooves 22a shown in FIG. 9, the surfaces with the quantum dots 18 formed on cross each other, whereby the polarization dependency can be reduced. The cone-shaped grooves 22c shown in FIG. 10 may be formed. The quantum dots 18 are formed on a plurality of surfaces having normal directions which are different each other, whereby the polarization dependency can be reduced.

Figure 11:
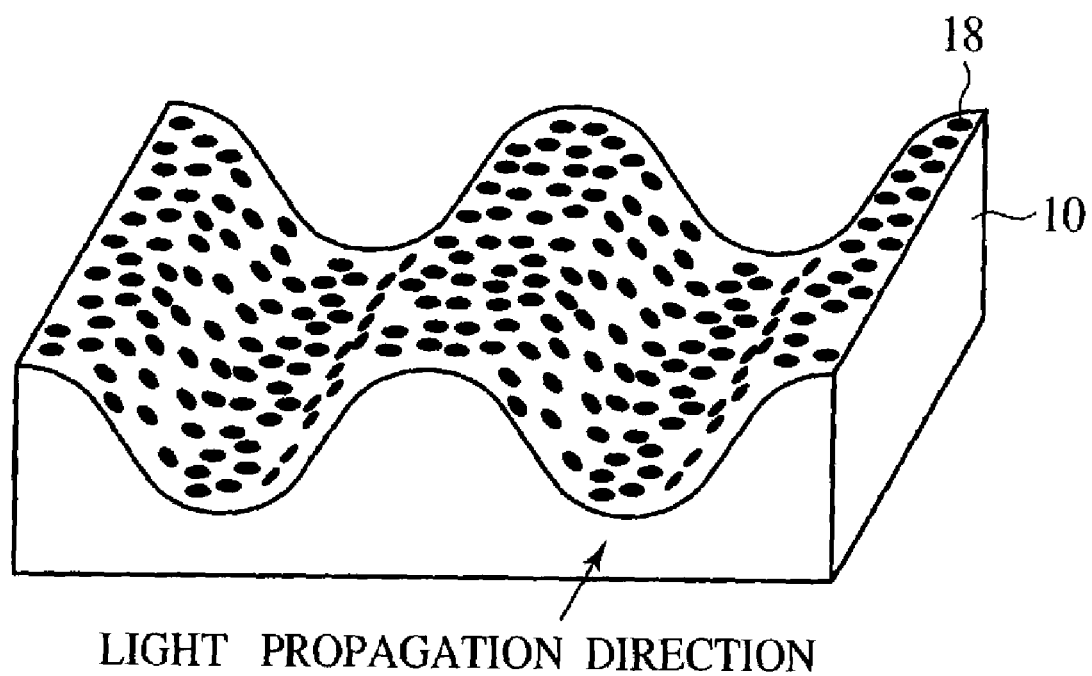
FIG. 11 is a conceptual view of the optical semiconductor device according to a modified embodiment of the present invention (Part 3).
Figure 12:
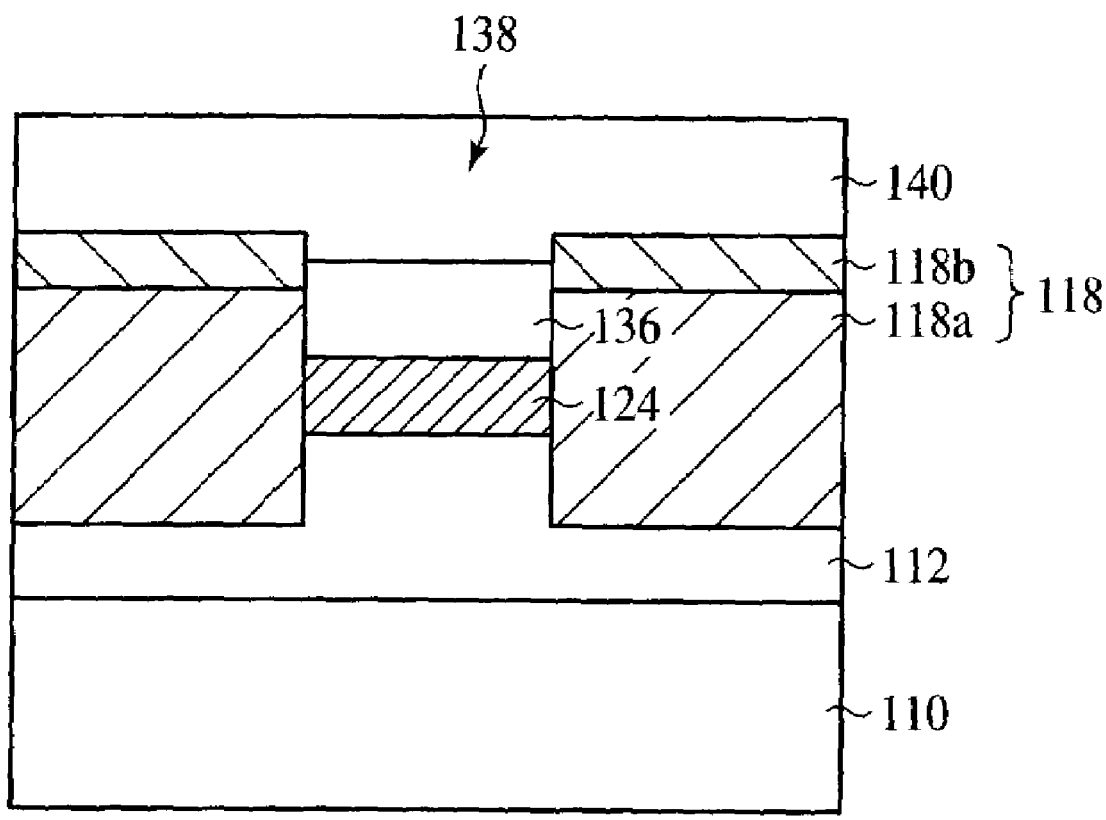
FIG. 12 is a sectional view of the conventional optical semiconductor device.
Figure 13:
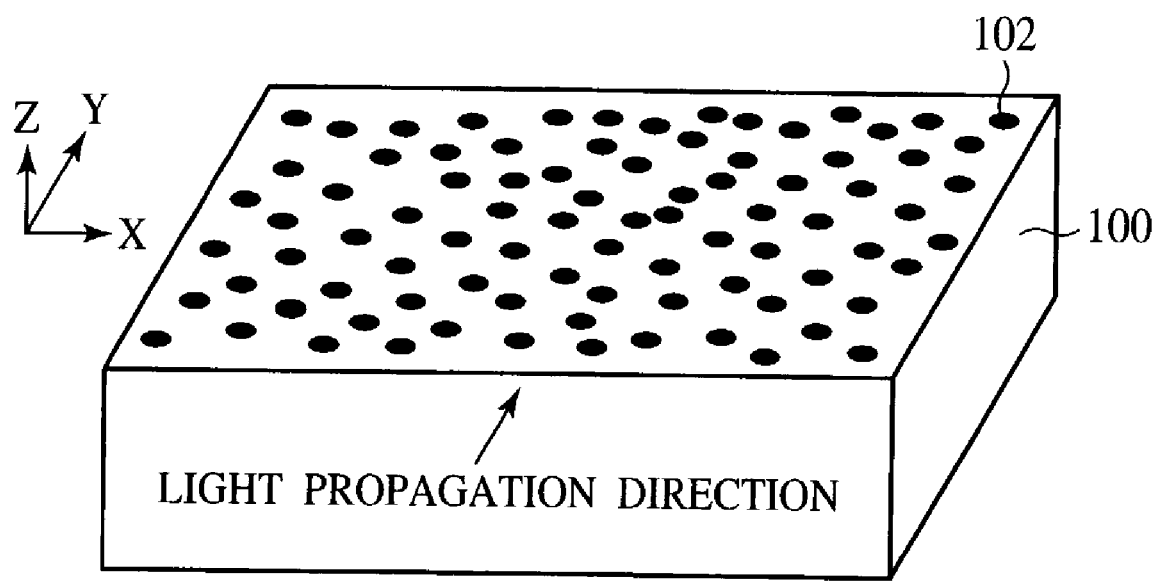
FIG. 13 is a conceptual view of the proposed optical semiconductor device.

In the above-described embodiments, the quantum dots are formed on the flat surfaces. However, the quantum dots are not formed essentially on the flat surfaces and maybe formed on curved surfaces. As exemplified in FIG. 11, the quantum dots 18 may be formed on the wavy surfaces. The quantum dots 18 are formed on wavy surfaces, whereby the polarization dependency can be reduced.

What is claimed is:

1. An optical semiconductor device comprising:
   an active layer including a plurality of quantum dots;
   a lower clad layer formed below the active layer; and
   an upper clad layer formed above the active layer,
   said plurality of quantum dots being formed on a plurality of surfaces whose normal directions are different from each other,
   wherein each surface has a normal direction different from a normal direction of any one of the other surfaces, and
   said plurality of quantum dots are formed on each surface, respectively,
   the quantum dots are formed on a curved surface.

2. An optical semiconductor device according to claim 1, wherein the curved surface is a wave-shaped curved surface.

* * * * *